(12) United States Patent
Kianush et al.

(10) Patent No.: US 8,503,507 B2
(45) Date of Patent: Aug. 6, 2013

(54) METHOD FOR USING A MULTI-TUNE TRANSCEIVER

(75) Inventors: Kave Kianush, Eindhoven (NL); Volker Gierenz, Muelheim an der Ruhr (DE); Hendrik Van der Ploeg, Waalre (NL)

(73) Assignee: Catena Holding BV, Delft (NL)

( * ) Notice: Subject to any disclaimer, the term of this patent is extended or adjusted under 35 U.S.C. 154(b) by 53 days.

(21) Appl. No.: 13/001,178

(22) PCT Filed: Dec. 17, 2010

(86) PCT No.: PCT/US2010/060946
§ 371 (c)(1),
(2), (4) Date: Jul. 14, 2011

(87) PCT Pub. No.: WO2011/149495
PCT Pub. Date: Dec. 1, 2011

(65) Prior Publication Data
US 2011/0292973 A1    Dec. 1, 2011

Related U.S. Application Data

(60) Provisional application No. 61/349,447, filed on May 28, 2010.

(51) Int. Cl.
*H04B 1/00* (2006.01)

(52) U.S. Cl.
USPC ........... 375/147; 375/136; 375/316; 375/222; 375/346; 455/63.1; 455/296

(58) Field of Classification Search
USPC ........ 375/147, 136, 316, 222, 346; 455/63.1, 455/296
See application file for complete search history.

(56) References Cited

U.S. PATENT DOCUMENTS

| | | | |
|---|---|---|---|
| 5,999,793 A | 12/1999 | Ben-Efraim et al. | |
| 6,433,749 B1 | 8/2002 | Thompson | |
| 2005/0184905 A1* | 8/2005 | Kobayashi | 342/357.15 |
| 2007/0004371 A1* | 1/2007 | Okanobu | 455/324 |
| 2010/0029210 A1* | 2/2010 | Kaltiokallio et al. | 455/62 |

* cited by examiner

*Primary Examiner* — Leila Malek
(74) *Attorney, Agent, or Firm* — Fasth Law Offices; Rolf Fasth

(57) ABSTRACT

The method is for using a multi-tune transceiver. A single oscillator (VCO/DCO) is provided that is electronically connected to a divider. An input channel is provided that is in communication with the divider and an analog-to-digital converter. The input channel has a first bandwidth and the converter has a second bandwidth that is broader than the first bandwidth. The single oscillator (VCO/DCO) operates at a frequency higher than frequencies inside the reception band such as the FM band. The divider divides the frequency of the single oscillator that is used as input when producing overlapping sub-bands that cover the entire reception band.

10 Claims, 12 Drawing Sheets

| integer N | VCO frequency | LO frequency |
|---|---|---|
| 96 | 5990,400 MHz | 106,971 MHz |
| 95 | 5928,000 MHz | 105,857 MHz |
| 94 | 5865,600 MHz | 104,743 MHz |
| 93 | 5803,200 MHz | 103,629 MHz |
| 92 | 5740,800 MHz | 102,514 MHz |
| 91 | 5678,400 MHz | 101,400 MHz |
| 90 | 5616,000 MHz | 100,286 MHz |
| 89 | 5553,600 MHz | 99,171 MHz |
| 88 | 5491,200 MHz | 98,057 MHz |
| 87 | 5428,800 MHz | 96,943 MHz |
| 86 | 5366,400 MHz | 95,829 MHz |
| 85 | 5304,000 MHz | 94,714 MHz |
| 84 | 5241,600 MHz | 93,600 MHz |

$f_{VCO,max} = 6$ GHz; $N_{var} = 7$; $N_{fixed} = 8$

US 8,503,507 B2

METHOD FOR USING A MULTI-TUNE TRANSCEIVER

PRIOR APPLICATION

This application is a U.S. national phase application based on International Application No. PCT/US10/060946, filed 17 Dec. 2010.

TECHNICAL FIELD

The invention relates to a method for using a multi-tune transceiver.

BACKGROUND AND SUMMARY OF THE INVENTION

Many wireless consumer products provide an increasing number of features and functions while the size and power consumption is decreased. This development has been primarily due to a higher integration level enabled by advances in sub-micron technology. For example, today's mobile telephones have more features such as FM radio TRX, Bluetooth and GPS as standard features. This was not the case a couple of years ago. This trend of adding new features to the mobile telephones is likely going to continue such as by adding features related to WiFi, DVB-H and NFC (Near Field Communication). At a low attachment rate, these wireless features are often implemented as separate integrated circuits (ICs). However, once a group of features have become standard for mobile telephones, there is a strong motivation to combine the features on the same IC to reduce cost and footprint. Unfortunately, despite the advantages of concurrent operation of features the potential cost savings beyond IC package, crystal reference and power management remain relatively limited. Moreover, concurrent operation of transceivers in close proximity, or on the same IC, brings additional coexistence drawbacks. The most severe coexistence problem is crosstalk between tuner sections. For example, mutual coupling between two oscillators in two separate tuners can cause interference and distortion in both receivers.

Similarly, high-end car radio applications require multiple receivers with multiple standards. There are triple FM receivers operating concurrently including main channel, background scanning and RDS/TMC. Digital Broadcasting standards such as DAB family (DAB, DAB+, T-DMB and variants), DRM/DRM+ and HD have dual receiver that require diversity and/or multiple services. There are combined analog/digital receivers that operate concurrently, such as concurrent FM and DAB reception for seamless FM/DAB blending. It is important to realize that there are numerous obstacles that hinder the effective integration of multiple tuners on the same IC due to coexistence challenges. Moreover, despite the availability of power from car batteries, excessive power dissipation in one IC is still not acceptable. Additionally a large chip area of the combined functions leads to a lower yield and therefore higher costs. The combination of large chip area and power dissipation makes the IC packages expensive. There is, therefore, a need for a multi-standard multi-tuner transceiver concept that addresses and overcomes the problems and drawbacks outlined above.

The method of the present invention provides a solution to the above-outlined problems. More particularly, the present invention is directed to a method for using a multi-tune transceiver. A single oscillator is provided that is electronically connected to a divider. An input channel is provided that is in communication with the divider and an analog-to-digital converter. The input channel has a first bandwidth and the converter has a second bandwidth that is broader than the first bandwidth. The single oscillator operates at a frequency higher than frequencies inside the reception band such as the FM band. The divider divides the frequency of the single oscillator that is used as input when producing overlapping sub-bands that cover the entire reception band.

DETAILED DESCRIPTION

Figure 1:
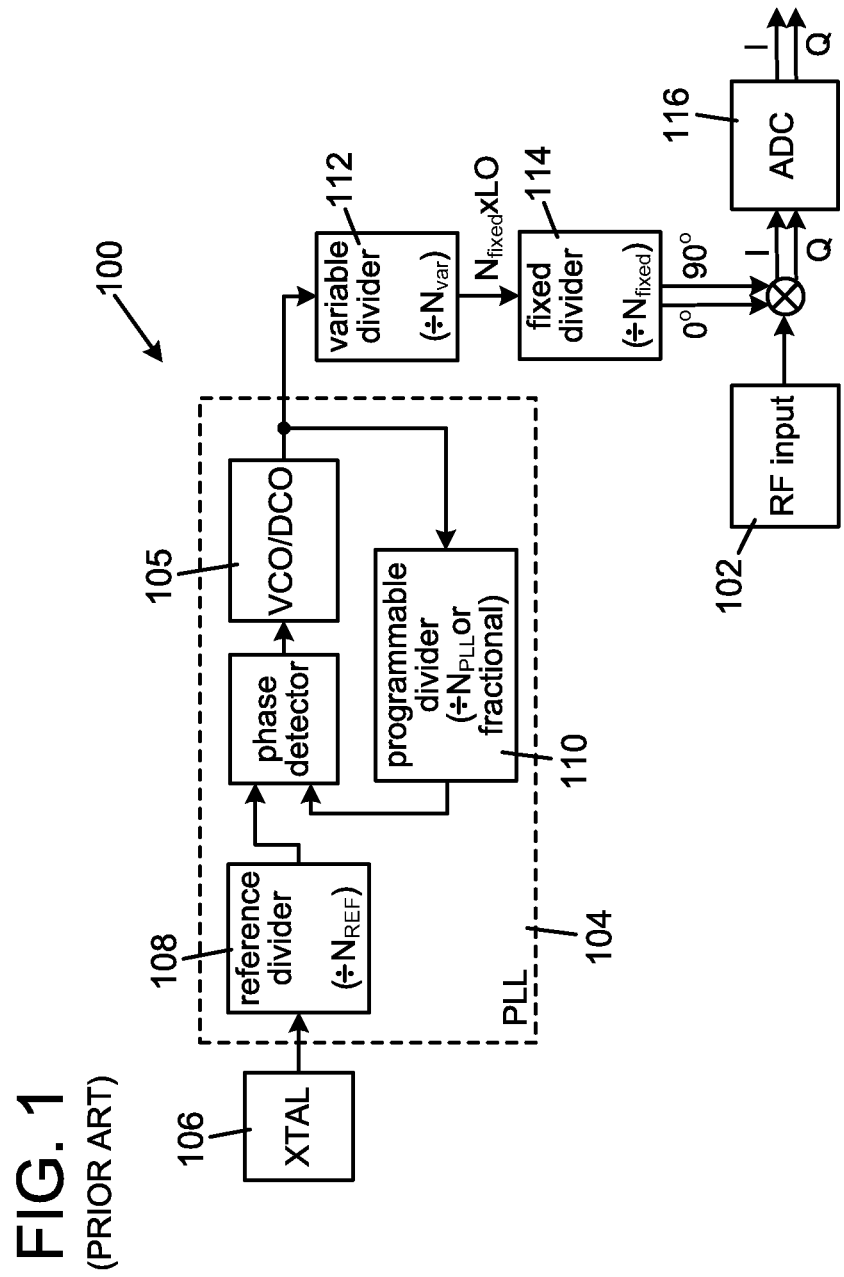
FIG. 1 is a conventional simplified integrated receiver block diagram showing conventional LO generation scheme.

In general, LO (local oscillator) generation and ADC (analog-to-digital converter) functions play an important role in the method of the present invention to multi-tuner receiver implementation. ADCs normally have a bandwidth that is only wide enough to be able to handle one channel. FIG. 1 shows a simplified low-IF (intermediate frequency) receiver block diagram 100 that describes a LO generation scheme in more detail. In general, the low IF is the difference between the LO frequency and the RF input 102 which means for FM applications the LO frequency should be close to the frequency of the FM band. For FM broadcast reception, the system parameters include the integrated PLL 104, shown inside the dotted box that has an integrated VCO/DCO 105 in the 2-7 GHz range. Frequency steps are often determined by the crystal reference (XTAL) frequency 106, the reference divider 108 and the programmable divider settings 110 that chooses the VCO frequency. Because the oscillator runs at very high frequencies, the oscillator frequency is divided to the required FM frequency (65-108 MHz depending on the geographical region) by the variable 112 and fixed dividers 114 outside the PLL block. The fixed divider is usually dividing by 2/4/8. Divide-by-2 is used to generate the required 0° and 90° phase angles for quadrature mixing. Divide-by-4 can also generate quadrature LO signals, but with better accuracy. If the LO signals are not at exactly 90 degrees, there may be undesirable image signal reception in the low-IF receiver. To avoid this, quadrature phase correction may be carried out, preferably in the DSP section of the receiver. Divide-by-8 is sometimes used to generate additional signals required for the suppression of the mixer 3rd and 5th harmonic responses. However, it is often not necessary to use a fixed divider. What is required is the multi-phase LO signals for the mixer operation. The fixed divider example is only a simple method of generating these signals that is commonly used.

LO and mixer blocks convert the desired RF signal into the IF channel. The bandwidth of the IF-ADC 116 should be wide enough to accommodate the IF channel, typically about 0.3-0.5 MHz for a low-IF architecture of an FM receiver. The PLL (phase locked loop) frequency synthesizer has to accurately tune to the desired frequency to ensure that the desired IF signal falls fully into the ADC bandwidth and can be demodulated in the DSP (digital signal processor) without distortion.

Figure 2:
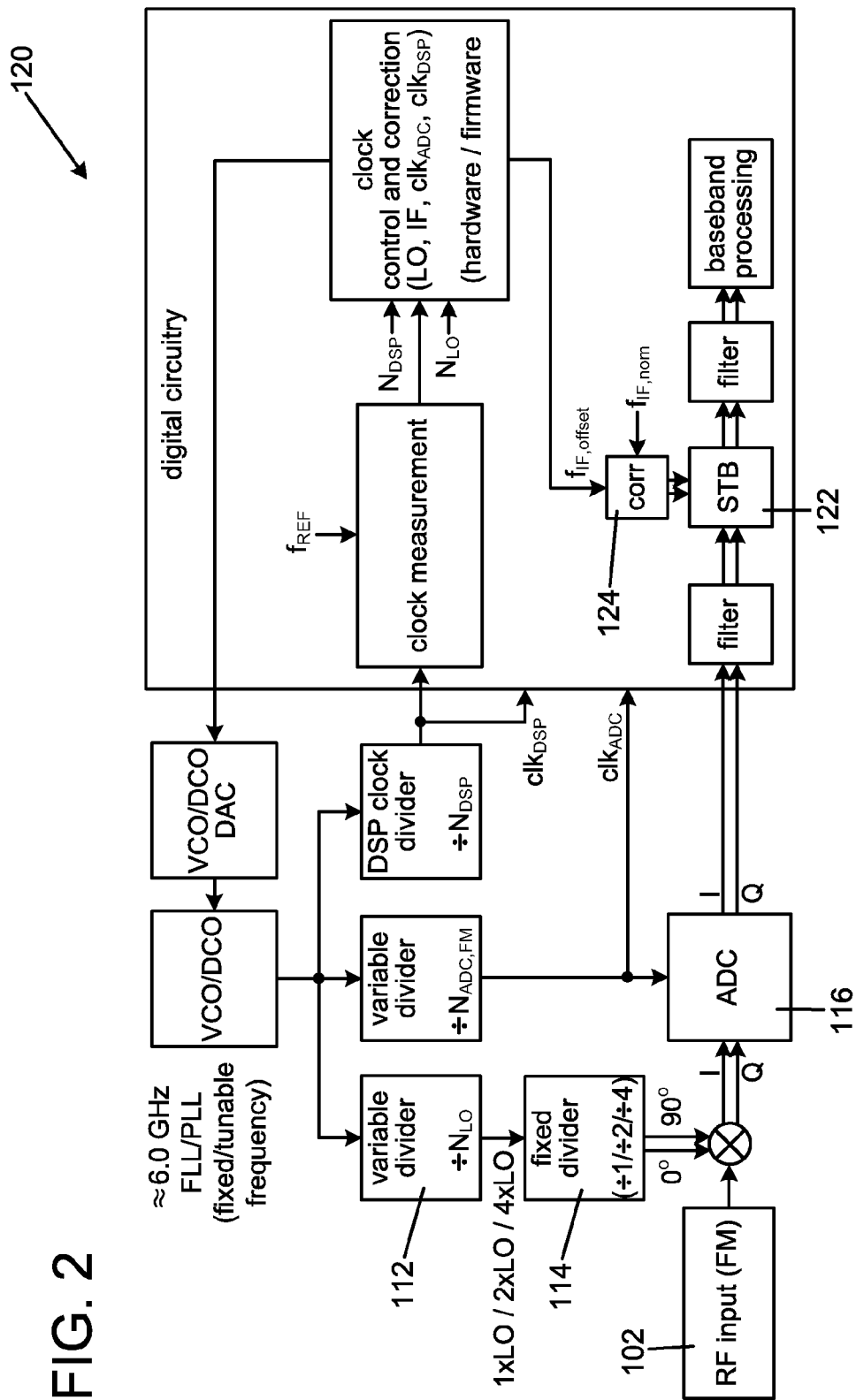
FIG. 2 is a feed-forward IF frequency offset correction scheme for the integrated receiver architecture.

The novel and non-obvious idea or insight of making the ADC bandwidth wider than the channel bandwidth has a number of surprising system advantages, some of which are also beneficial to multi-tuner applications. For example, the PLL tuning frequency accuracy requirement may be relaxed to a point of making it possible to reduce the number of oscillators to a single oscillator. Coarse tuning at RF (radio frequencies) is acceptable as long as the desired signal remains within the wider ADC bandwidth. IF frequency offset correction is needed in the DSP before demodulation of the signal to avoid distortion. FIG. 2 shows a robust frequency error correction scheme 120 applied to the low-IF receiver architecture of the present invention.

The signal path is again the quadrature low-IF channel as described previously. After the ADC operation, further signal processing is carried out in the DSP. Before channel filtering and demodulation, the digital IF channel is, preferably first decimated and then converted to zero Hz by the Shift-To-Baseband (STB) block 122. The STB block may be a quadrature mixing stage implemented in the digital domain. The required frequency shift may in fact be the nominal IF value of the receiver. If the RF tuning is accurate, the STB operation shifts the desired signal to the desired zero Hz frequency. If the RF tuning accuracy is low a correction to the nominal IF value is required. This IF-frequency offset can be measured quite accurately by a frequency counter that counts the oscillator pulses by using an accurate crystal reference frequency. The difference between the measured oscillator frequency and the required frequency may then be the frequency offset value that is used for correction 124 in the STB operation.

The frequency tuning system that is depicted in FIG. 2 is based on Frequency Lock Loop (FLL) principle. The application of FLL is not strictly essential for the present invention but it is the preferred implementation. The main advantage of this specific implementation is that it requires only a simple coarse tuning mechanism at RF. Coarse frequency tuning may be carried out by the DCO, similar to the AD-PLL concept. However, unlike the AD-PLL case, the resolution of the DCO can be quite low. Typically 8 or 9 bits resolution is adequate that is readily achievable in modern CMOS processes.

The DCO frequency is measured by the FLL circuit using a frequency counter that has a much higher resolution than the DCO. Frequency counter resolution is determined by the fine tuning steps required for the frequency offset correction in the STB. The most significant bits, for example first 9 bits, may be used to set the DCO frequency. The remainder bits in the counter are used to calculate the frequency offset. The frequency error correction takes place in the feed-forward loop to the STB block. This feed-forward error correction has the advantage of low-resolution requirement for the DCO and does not suffer from stability or adjacent channel pulling associated with AFC feedback loops. This feed-forward frequency error correction scheme can also be applied to more conventional PLL tuning systems. With error correction, the tuning PLL can be integer-N with coarse tuning steps. Alternatively, a combination of a coarse-grain FLL with a limited range integer PLL is also an attractive solution. All solutions simplify the design including lower power consumption and smaller chip area and avoid fractional spurs. The frequency offset correction can be carried out in the same way as the previous example or by calculating the difference between the required frequency and the actual frequency setting, for example in the system microcontroller that determines the settings for the PLL tuning system. The calculated frequency offset is then used for correction in the STB operation as in the previous FLL case.

As indicated above, in system applications with multiple tuners operating concurrently, crosstalk deteriorates the performance of all receivers. The main mechanism that causes crosstalk between tuners is often mutual coupling between oscillators of these tuners. Dual FM tuner applications for background scanning suffer from this drawback. One receiver is tuned to the desired channel while the other receiver scans the FM band for alternative frequencies with the same program and/or other services. When the frequencies of the desired and the scanned channels are close, the resonant circuits of the two oscillators have a tendency to couple to each other thereby causing disturbances in both channels. However, when the IF-ADC bandwidths in these receivers are wide enough to accommodate multiple channels, it is possible to reduce or avoid oscillator coupling. It should be noted that the ADC dynamic range requirements, related to noise and linearity, become more stringent as the bandwidth becomes wider.

Figures 3, 4:
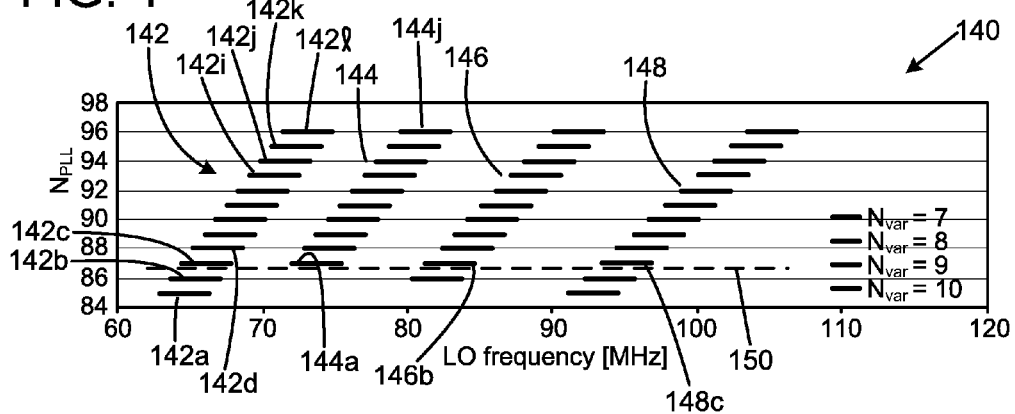
FIG. 3 is a LO frequency steps as a function of PLL divider settings.
FIG. 4 is a schematic view depicting FM LO sub-band frequencies as a function of divider settings.

To take advantage of the benefits of wider IF-ADC bandwidth, its impact on the LO tuning steps requirements is outlined below. FIG. 3 shows a table 130 including the frequency steps 132 at VCO and LO positions 134 as function of programmable divider setting of the PLL in FIG. 1. The VCO frequency, in the 6 GHz region, is divided outside the PLL to the desired LO by a variable divider, set to 7 for the frequencies shown and a fixed divide-by-8 to generate the quadrature LO signals. The divider thus divides the frequency of the single oscillator and it does this in discrete steps. The set of divided frequencies is then used to convert the RF band into IF sub-bands, where the bandwidth of each of the IF sub-bands fits into the bandwidth of the IF ADC.

The PLL programmable divider is integer-N 136, varying from 96 down to 84 covering frequencies from 93.6 to almost 107 MHz in the FM band. Other frequencies can be generated by changing the setting of the variable divider.

FIG. 3 shows that the LO takes steps of approximately 1.1 MHz as a function of the PLL integer-N setting 136. To realize a practical FM receiver with this PLL, IF-ADC bandwidth must therefore be wider than 1.1 MHz. Furthermore, it would be particularly beneficial to make this bandwidth at least 1.8 MHz so that it would also cover the entire LW/MW broadcast bands as well. The multi-tuner AM/FM concept and its implications are explained separately in later sections of this detailed description.

When the FM IF-ADC bandwidth is set to ±1.8 MHz, the FM band is digitized by this IF-ADC in sub-bands of 3.6 MHz (±1.8 MHz). When the ADC bandwidth is only wide enough for one channel then it is necessary for every tuned frequency to have a tuning point. This means it is necessary to have many tuning points to cover the entire FM band. FIG. 4 shows a graph 140 including these FM LO sub-band frequencies for various divider settings. The PLL integer-N programmable divider is varied from 85 to 96 whereas the variable divider outside the loop is varied from 7 to 10 as shown by the schematic "ladders" 142, 144, 146 and 148.

It is important to note that any FM LO frequency can be generated in at least two sub-bands, as seen when looking upwardly vertically from the x-axis. Therefore there is no longer a unique relation between the received FM frequency and the PLL VCO frequency. In conventional systems, the division ratio of the PLL corresponds to a unique frequency so that any unique frequency from the receiver antenna corresponds to a unique on the PLL. The PLL integer-N programmable divider and the variable divider settings of the present invention generate overlapping sub-bands, where the same LO frequency can be generated using quite different VCO frequencies. For example, a LO frequency of 65 MHz corresponds to many PLL integers such as integers 85, 86, 87 and maybe 88, as depicted by lines 142a, 142b, 142c and 142d which means there is no longer any unique frequency that corresponds to a particular division ratio of the PLL. This means different adjacent tuners do not have to use the same division ratio which reduces the risk of interference and coupling between the oscillators. The sub-bands are overlapping because the ADC has a bandwidth that is wider than the bandwidth of the incoming channel. For example, the first lowest line 142a at PLL integer 85 overlaps line 142b at the PLL integer 86 as the "ladder" 142 is formed as seen from the x-axis. Another realization is that it is necessary to increase the programmable PLL divider to between about 94-96, as represented by lines 142i, 142j, 142k and 142l when the variable divider is set to 7 to cover the gap in the LO frequency formed between, for example, the gap between line 142c ($N_{var}$ setting of 7) and line 144a ($N_{var}$ setting of 8) of the second ladder 144 that extends between about 66 MHz and 72 MHz. In other words, at the programmable divider setting of 87 there is a gap between the first line 142c when variable divider is set to 7 and the line 144a when the variable divider is set to 8. This frequency gap can be covered by changing the programmable divider to between 93-96 (when the variable division ratio is set to 7) or so. The wider the bandwidth of the ADC the longer are the lines in FIG. 4 so at some width of the ADC bandwidth the lines 142a-142l represented by the variable divider 7 (the first ladder 142) start to touch the lines 144a-144j of the ladder 144 represented by the variable divider setting of 8 so it is no longer necessary to change the programmable divider (FIG. 1, 110) because the entire LO frequency may be covered by using only one programmable divider at an appropriately selected programmable divider integer (FIG. 3, 136) while the variable divider (FIG. 1, 112) is changed from, for example, 7 to 10. In this way, when the lines 142c, 144a, 146b and 148c are sufficiently long (as represented by the wide ADC bandwidth) they may form a continuous horizontal line 150 (shown as a dashed line in FIG. 4 as discussed in more detail below) that extends from the LO frequency of about 62 MHz all the way up to about 111 MHz. This is an important and surprising realization of the present invention. Any frequency offset between the LO frequency and the actual required frequency is then corrected in the DSP part of the receiver as previously explained.

This system feature of overlapping sub-bands is very relevant to multiple tuner applications operating concurrently. Multiple identical receivers in close proximity or on the same IC may be simultaneously tuned to adjacent frequencies but with quite different VCO frequencies. The divider settings for the receivers are calculated by the system micro-controller to maximize the frequency distance between the receivers' oscillators, thereby minimizing any coupling between them. Therefore, by using IF-ADC bandwidth of ±1.8 MHz, the oscillator coupling for multiple FM tuners operating concurrently is greatly reduced. However, the system application still requires multiple PLL tuning systems with associated cost and power dissipation. The ultimate goal would be to use a single tuning system for all receivers tuned to different frequencies.

Figure 5:
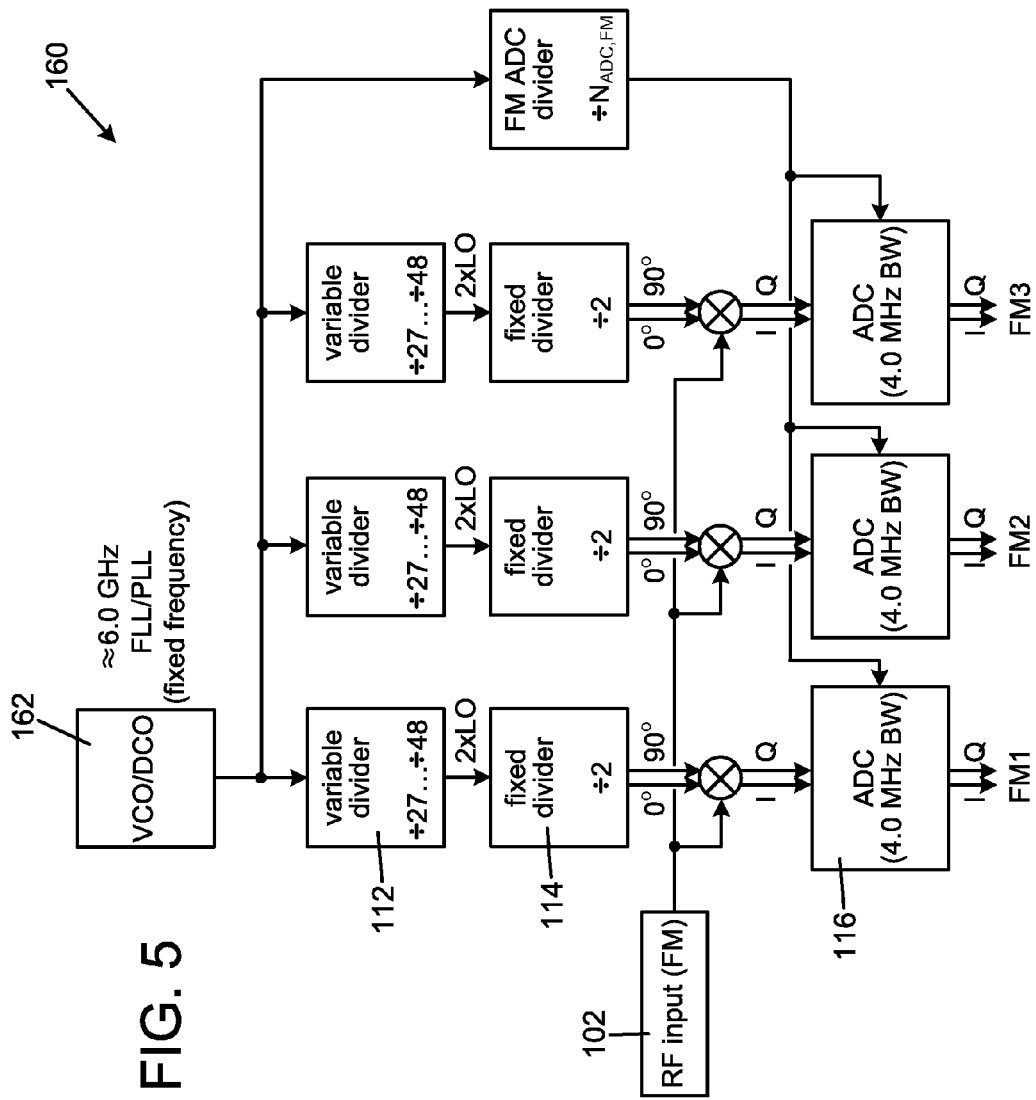
FIG. 5 is a triple-FM example of multi-tuner concept with fixed-frequency oscillator.

With reference to FIG. 5, the triple-FM receiver concept 160 has only a single tuning system (PLL/FLL) 162 that tunes the oscillator to a single fixed frequency of about 6 GHz. There is therefore no need for flexibility of programming the VCO/DCO frequency. The LO signals are generated by the combination of variable dividers and fixed divide-by-2 circuits for quadrature outputs. Each receiver can be tuned in coarse frequency steps of less than 4 MHz by changing its variable divider setting from 27 to 48. By choosing the IF-ADC bandwidth to be at least ±4 MHz wide, the overlapping sub-bands cover frequencies from about 62 MHz to 111 MHz for low-IF FM reception, as shown by the dashed line 150 in FIG. 4. In other words, by selecting the IF-ADC bandwidth at least 4 MHz wide, the FM LO sub-bands would look like a straight horizontal line 150 at the selected PLL Integer N instead of four "ladders" 142, 144, 146 and 148 as now depicted in FIG. 4. For example, if the PLL Integer N is 87 in FIG. 4 and the ADC bandwidth is at least 4 MHz then the end of the depicted line segment 142c for $N_{var}$ 7 extends to "touch" and even overlaps the beginning of the line 144a for $N_{var}$ 8 that has an end that in turn touches or even overlaps the beginning of the line 146b for Nvar 9 et cetera until a long continuous line 150 is formed that extends all the way from the LO frequency of about 62 to 111 MHz. The fixed-frequency oscillator may also be used for clocking the IF-ADC circuits, using the FM ADC divider, and/or clocking digital circuitry, using the DSP clock divider (FIG. 2).

The multi-tuner concept 160 shown in FIG. 5 makes very efficient use of a single simple PLL tuning system to provide all required LO signals as well the IF-ADC clocking signals. It has therefore a smaller chip area compared to conventional multi-tuner implementation that requires multiple tuning systems and of course dissipates less power in concurrent operation with its single oscillator system. Furthermore, due to the fact that all receivers operate with a single oscillator, by definition, there is no oscillator coupling in multi-tuner operation. The essential system criteria of the present invention include the frequency step size determined by the fixed-frequency oscillator, the variable divider range, the fixed divider and the IF-ADC bandwidth, such that overlapping sub-bands cover the entire reception band. Therefore, salient features of this fixed-oscillator multi-tuner concept can be preserved with other appropriately chosen combinations of the above parameters.

Figure 6:
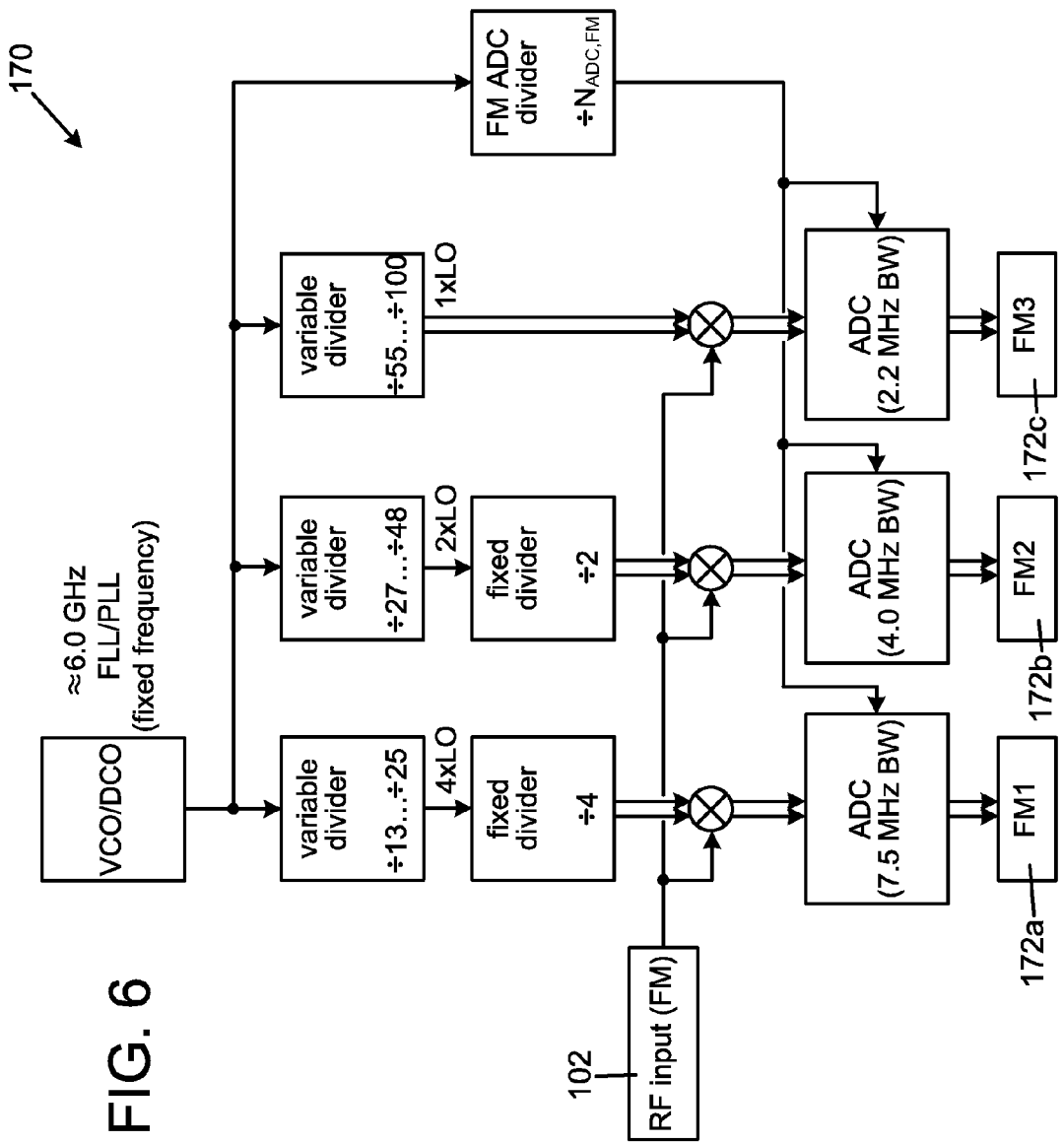
FIG. 6 is a schematic view depicting FM system configuration examples for various IF-ADC bandwidths.

FIG. 6 illustrates a system 170 for three different FM receiver implementations 172a, 172b and 172c. The fixed divider is different in the three receiver paths including divide-by-4, divide-by-2 and divide-by-1 (no divider). This means that the quadrature LO generation is carried out by fixed dividers in the first 2 receivers whereas the last receiver quadrature signals are directly generated by phase manipulation of the variable divider directly. Consequently, the variable divider ranges and the IF-ADC bandwidths may be adjusted such that the "fixed-oscillator criteria" are preserved for these receivers. The oscillator frequency may be maintained in the 6 GHz range. This parameter can also be varied to create yet more degrees of freedom. For example, if the oscillator frequency is increased by a factor of 2 to 12 GHz, it is possible to either insert an additional fixed divide-by-2 circuit in the LO path which is useful for quadrature LO generation or to further reduce the IF-ADC bandwidth which simplifies the ADC requirements.

This interrelation between the oscillator frequency, the divider range and architecture and the IF-ADC bandwidth can be manipulated to optimize system parameters for the given design criteria and boundary conditions.

Figure 7:
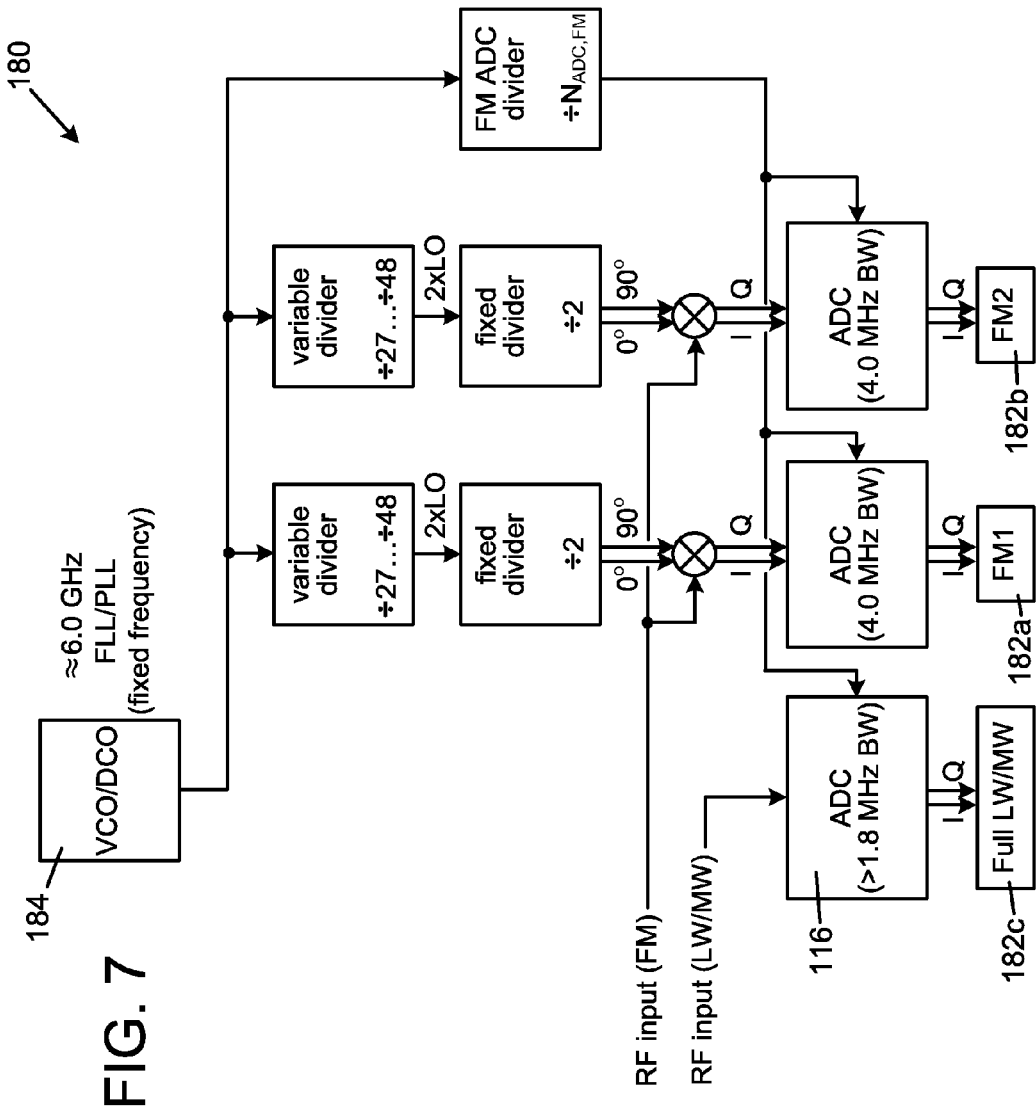
FIG. 7 is a dual FM, multiple-AM (LW/MW) example with fixed-frequency oscillator.

Earlier, it was described that when the ADC bandwidth is larger than 1.8 MHz, it would be wide enough to cover the entire LW/MW broadcast band. FIG. 7 shows a system 180 of a multi-standard multi-tuner concept applied to dual-FM 182a, 182b and a multiple-AM reception 182c. The two FM receiver configurations are the same as in FIG. 5. The oscillator frequency is in the 6 GHz range, using variable divider, fixed divide-by-2 and FM IF-ADC bandwidths of 4 MHz. The AM signal path does not require mixing to low IF as the entire band (120 kHz-1.7 MHz) can be directly digitized by the 1.8 MHz wide AM-ADC. This brings further reduction of system complexity for AM reception and makes it possible to receive multiple channels from a single tuner. Since all AM channels are digitized simultaneously by the AM-ADC, the number of concurrent received channels may be determined only by the signal processing capacity of the DSP part of the receiver.

To extend AM reception to SW (2.7 MHz-27.0 MHz), a low-IF receiver signal path is still required similar to the FM channel. This means that there will again be quadrature LO generation for AM SW receiver that is also generated from the fixed oscillator in the system of the present invention. Due to the lower frequency of the SW band compared to FM, the LO divider chain requires additional divider stages. This gives quite a high resolution for LO generation that, when combined with the 4 MHz IF-ADC bandwidth, can easily cover the entire SW band from a single fixed-frequency oscillator 184.

Figure 8:
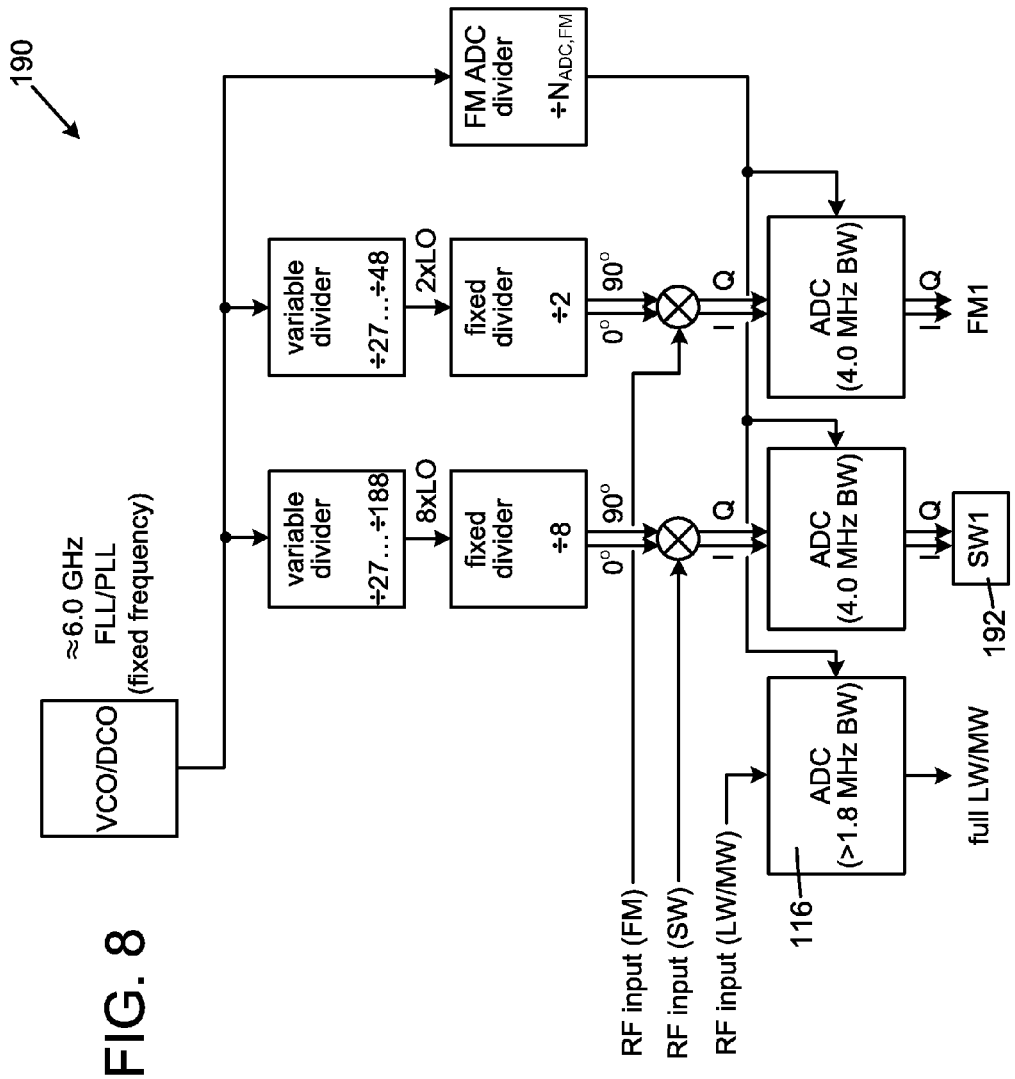
FIG. 8 is a multi-Standard multi-tuner example for single-FM, single-SW, and multiple-AM.

FIG. 8 shows a system 190 that extends to SW band reception 192. Alternatively to the figures given in the drawing, a different compromise between fixed and variable SW divider range and SW ADC bandwidth can be made.

The multi-standard multi-tuner examples described above have been limited to analog broadcast reception, FM and AM (LW/MW/SW). However, the basic principles of fixed-oscillator tuner concept according to the present invention can also be applied to other receivers.

Below are a few examples covering digital broadcast reception and Global Positioning System (GPS) applications. As described earlier, most mobile phones today have FM radio and GPS function as standard features. There is a continuous need for reducing cost and power dissipation of such functions in mobile telephone applications. Moreover, there are a number of GPS and FM radio functions operating concurrently which raise coexistence concerns. Therefore, this application is very suitable for the proposed fixed-frequency multi-standard multi-tuner concept.

Figure 9:
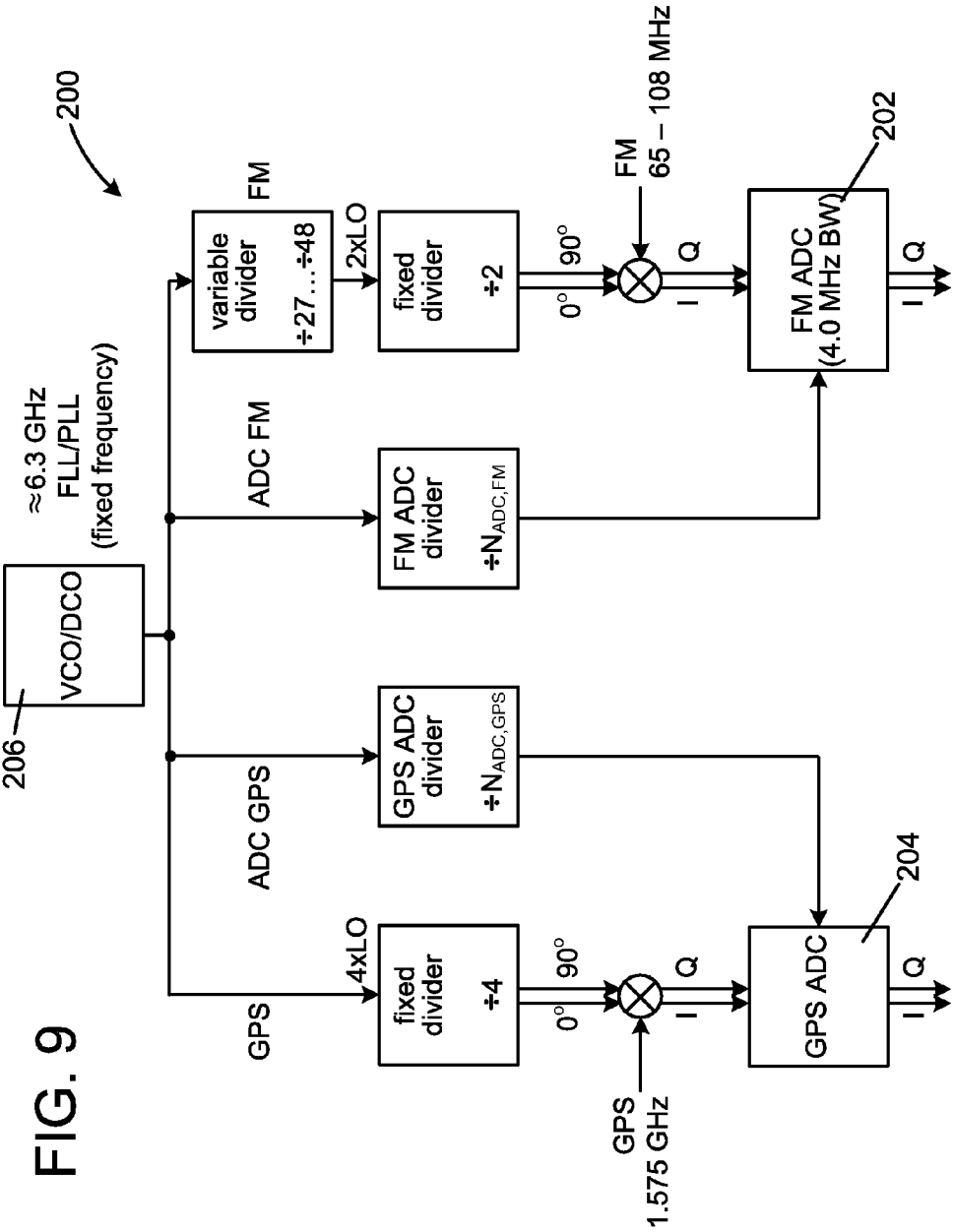
FIG. 9 is a combined FM/GPS example using fixed-frequency oscillator.

FIG. 9 shows a system 200 of combined FM and GPS receivers 202, 204 using the fixed-frequency oscillator concept. The FM receiver has the same system parameters as shown in FIG. 5. However, the oscillator frequency is chosen to be slightly higher than 6 GHz to facilitate GPS reception. Since the divide-by-4 operation is used to generate quadrature LO signals for the low-IF GPS receiver, the oscillator frequency should be in the order of 6.3 GHz (4×GPS frequency at 1.575 GHz). The exact frequency should be adjusted to accommodate for the selected GPS receiver IF frequency (typically a few MHz). This is a minor modification that does not impact the overall system configuration. The basic advantage of this combined FM/GPS system configuration is that it utilizes one fixed-frequency oscillator 206 to generate all LO and clock signals required for both receivers. Concurrent operation is possible with the single oscillator. Therefore, the chip area and power dissipation are reduced and the FM/GPS oscillator coexistence problem is eliminated. The extension from GPS to other positioning systems like Galileo or Glonass from here is a straightforward extension.

There are numerous digital radio broadcasting applications that would also benefit from the fixed-frequency oscillator concept. DRM, DRM+ and HD radio standards operate in the existing AM and FM bands. Therefore, all previous multi-standard multi-tuner examples can be applied to these standards as well. The only consequence is that IF-ADC bandwidth figures may need to be slightly increased to accommodate for the wider channel bandwidths of the digitally modulated signals. DAB, DAB+ and T-DMB family of standards, on the other hand, use totally different frequency bands; band-3 (170-240 MHz) and L-band (1452-1492 MHz). In practice, DAB reception is invariably combined with FM for various reasons. The concurrent operation takes place when receiving audio and data services simultaneously from the two separate receivers. Another use case example, where both receivers are operational simultaneously, is seamless FM/DAB blending. The fixed-frequency oscillator configuration example for multiple FM radios shown in FIG. 5 is adequately flexible to be combined with DAB reception for all bands.

Figure 10:
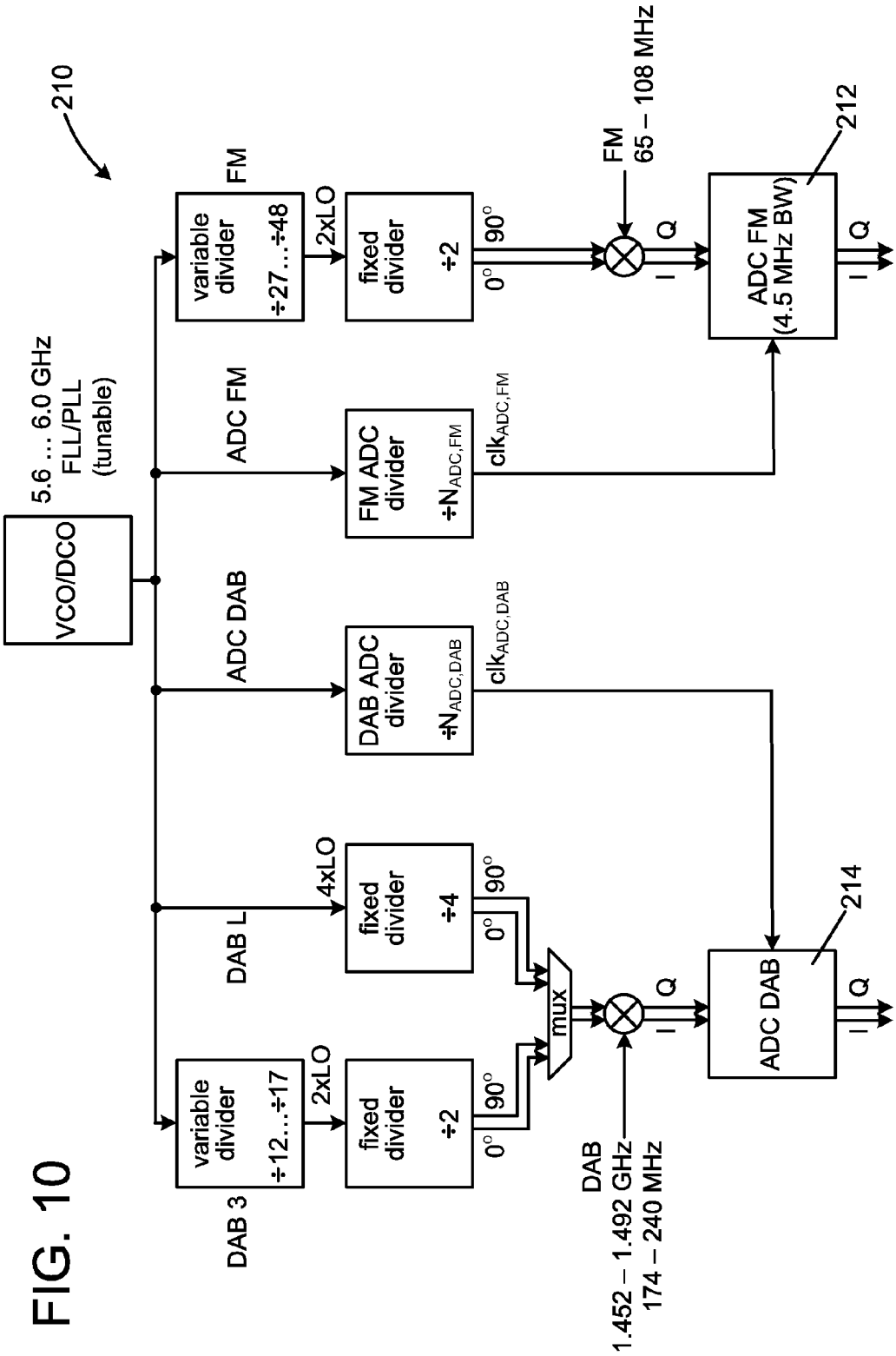
FIG. 10 is a combined FM/DAB receiver using single oscillator system.

FIG. 10 shows a system 210 including the combined FM/DAB receiver architecture including FM receiver 212 and DAB receiver 214 that uses a single oscillator system for concurrent operation. The tuning system is in principle a standard PLL as used for DAB reception. The frequency range of the VCO may be selected in the 6 GHz range to facilitate concurrent operation with FM. The tuning frequency range of the VCO is from 5.6 to 6.0 GHz to cover both band-3 and L-band. The VCO frequency is set by the desired DAB channel. Irrespective of the actual chosen DAB frequency, the variable divider in the FM LO path can be set such that any arbitrary FM channel is brought to within the ±4.5 MHz FM IF-ADC bandwidth. It should be noted that the IF-ADC bandwidth should be slightly larger, 4.5 MHz instead of 4.0 MHz, to accommodate for the VCO frequency variation. If and when the PLL frequency is changed due to a new DAB frequency, FM LO path immediately compensates by changing the variable divider setting and the frequency correction value in the DSP section of the receiver. This retuning of the FM channel is very fast and can be made inaudible in the DSP. The FM section can be extended with multiple tuners. The system configuration may use only one tuning system for single DAB and multiple-FM applications. Again, system complexity, chip area and power dissipation are reduced and FM/DAB oscillator coexistence problem has been eliminated.

One consequence of having a tunable VCO instead of a fixed-frequency VCO is that now also the DSP clock $clk_{DSP}$, the ADC clock $clk_{ADC}$ and thus the sampling rate $f_s$ of the digitized receive channel information may vary with the actual receive channel RF frequency. This, however, can be compensated for in the digital domain as explained below.

Multiple DAB receivers operating concurrently when receiving multiple audio and data services would receive multiple DAB channels from a fixed-frequency oscillator (like in the previous FM examples) to avoid oscillator pulling between the tuners. To achieve this, the system parameters are modified to accommodate for the wider DAB broadcast bands at higher frequencies. This would typically translate to higher oscillator frequency and wider IF-ADC bandwidth or a combination of both. The fixed-frequency DAB receiver of the system 220 shown in FIG. 11 uses a fixed-frequency oscillator 222 at approximately 6 GHz as before, but requires a ADC 224 that has a much wider IF-ADC bandwidth of 24 MHz.

This makes the ADC design more challenging. Alternatively, the ADC bandwidth requirements can be relaxed if the oscillator frequency is increased to for example 12 GHz. Due to the robust nature of digital modulation, the IF-ADC dynamic range requirement for DAB is less stringent that for analog AM/FM receivers. Therefore, a wideband IF-ADC may be used for multiple-DAB applications.

Figure 11:
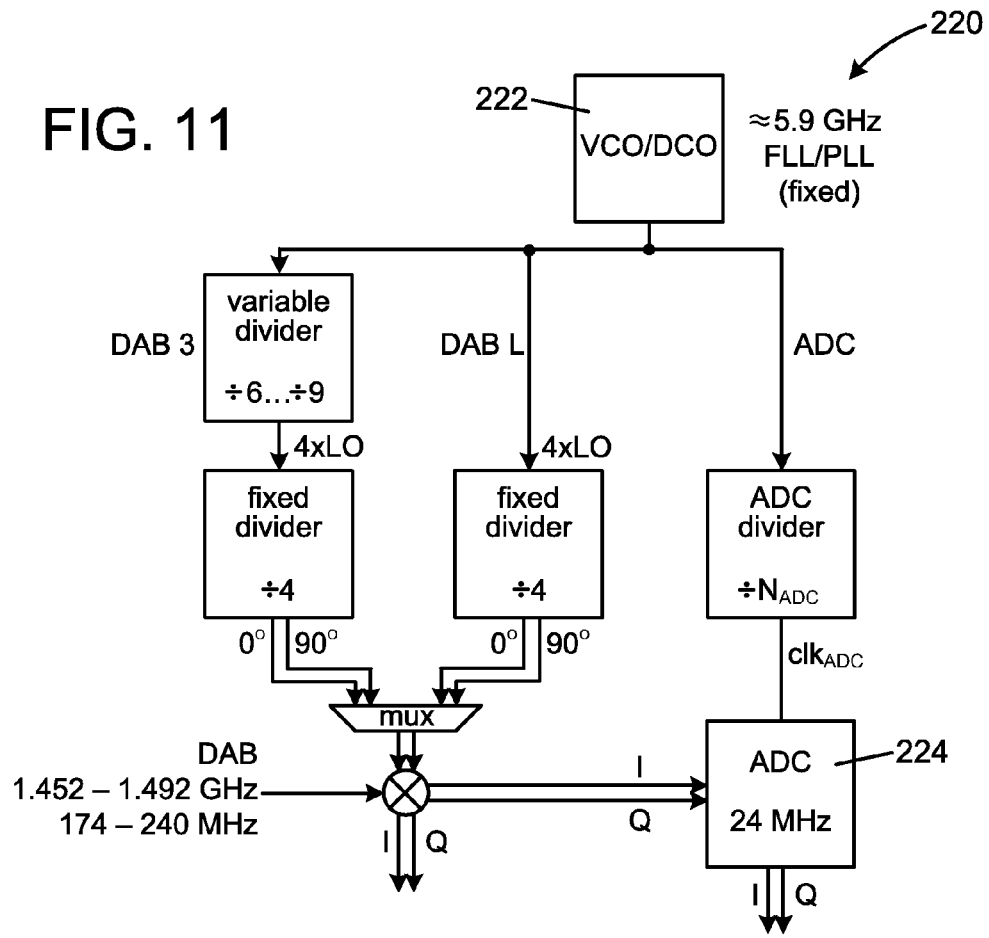
FIG. 11 is a DAB receiver architecture example using fixed-frequency oscillator.

One important feature of the present invention is that the fixed-frequency oscillator configuration of system 220 shown in FIG. 11 can be extended with multiple DAB tuners. Given that the oscillator frequency is close to 6 GHz, as shown previously, this concept is also extendable to include AM and FM applications. Multi-standard multi-tuner applications can therefore be addressed with the new fixed-frequency oscillator concept for simultaneous reception of multiple-DAB, multiple-FM and multiple-AM (LW/MW/SW) signals. In a separate example, fixed-frequency oscillator concept has been applied to FM/GPS combination that is very popular for mobile telephone applications. The fixed-frequency oscillator concept disclosed could be generic in nature and can therefore be applied to other receivers not covered by these examples.

As stated earlier, the described architecture system 210 in FIG. 10 can lead to a tuning-dependent spread of the ADC clock $clk_{ADC}$. The same holds for the sample rate $f_s$ of the digitized information as well as DSP circuitry clock $clk_{DSP}$. Normally, this would require a sample-rate conversion (SRC) circuitry to resample the data to a known sample rate to overcome negative effects due to a tuning-dependent data sample rate. An additional digital SRC would lead to additional computational overhead and thus to increased power dissipation during normal operation (i.e. receiving operation). The absolute tuning frequency dependent clocks $clk_{ADC}$ and $clk_{DSP}$ can be accurately calculated since the "FLL measurement" block is able to exactly measure the frequency $f_{DCO}$/NDSP at the output of the "RF frequency divider" block (FIG. 2) and the divider ratios NDSP, NADC, and NLO are known (FIG. 2). Thus, the frequencies of all derived clocks in the system can be exactly calculated.

This means it is possible to compensate for sampling-frequency dependent settings in the DSP part. This compensation step can be performed either by a system microcontroller but also and preferably by means of autonomous on-the-fly on-chip calculation. Assuming the STB block is implemented using a CORDIC rotator, the IF frequency is programmed by setting the phase-step Δphi in the associated phase-accumulator. This phase step Δphi can be calculated as Δphi=2×fIF/fs_CORDIC, where fs_CORDIC is usually proportional to clkADC. Therefore the IF mixer frequency would vary with a 1/clkADC characteristic in case $clk_{ADC}$ changes due to e.g. tuning to a different RF frequency. Not compensating for this effect would lead to an undesired offset of the received, which in turn would lead to undesired performance degradations. However, since $f_{DCO}$ can be exactly determined by means of measurements and on-chip calculations, also $clk_{ADC}$, $clk_{DSP}$, and fs_CORDIC can be exactly determined. Consequently, Δphi can be exactly determined for any programmed $f_{IF}$ and any spread of $clk_{ADC}$ (FIG. 3). This calculation usually only has to be done once after tuning, and thus does not lead to computational overhead during normal operation.

A very similar derivation of a sample-rate dependency correction can be given for the correction of a coefficient in 1st order recursive filters. The problem of the sample-rate dependency of the absolute filter bandwidth of FIR filters can be solved in various ways. For decimation filters the problem is less of an issue and thus the filters can be designed taking the maximum $f_s$ variation into account during design time (Option 1). For filters with a defined bandwidth, like channel- or audio-filters that require a well defined frequency characteristic for the pass—as well as the stop-band, either several sets of filter coefficients can be designed during design time and then—depending on the actual $f_s$—a suitable coefficient set is chosen that is then used for the filter operation at the actual $f_s$ (Option 2a), or an on-chip filter design procedure calculates the required filter coefficients on-the-fly to compensate every time fs changes for the variable $f_s$ (Option 2b).

Option 1 above does not need any correction and is thus trivial to implement, but its application is limited to a small subset of the FIR filters required in a complete transceiver system. Option 2a has the advantage of a simple implementation, but has the disadvantage of increased memory requirements, since a multitude of coefficients sets have to be stored for every $f_s$-corrected FIR filter. Option 2b needs to store a generic filter design routine only once, which can then be used for any FIR filter correction—independent from the range of the $f_s$ compensation range and accuracy. The required computational effort is rather negligible, since fs changes only during tuning when usually no signal processing is executed. One possible efficient and low-complexity FIR design approach is to calculate a suitable sin(x)/x function with a desired cut-off frequency ωc at discrete points and then window the sin(x)/x function with an appropriate pre-designed sampled window function, e.g. a Hamming window of suitable length, can be used. To compensate for the sample-rate dependency, the cut-off frequency ωe is scaled with a factor fs, corr that is inverse-proportional to the sample-rate fs.

Figure 12:
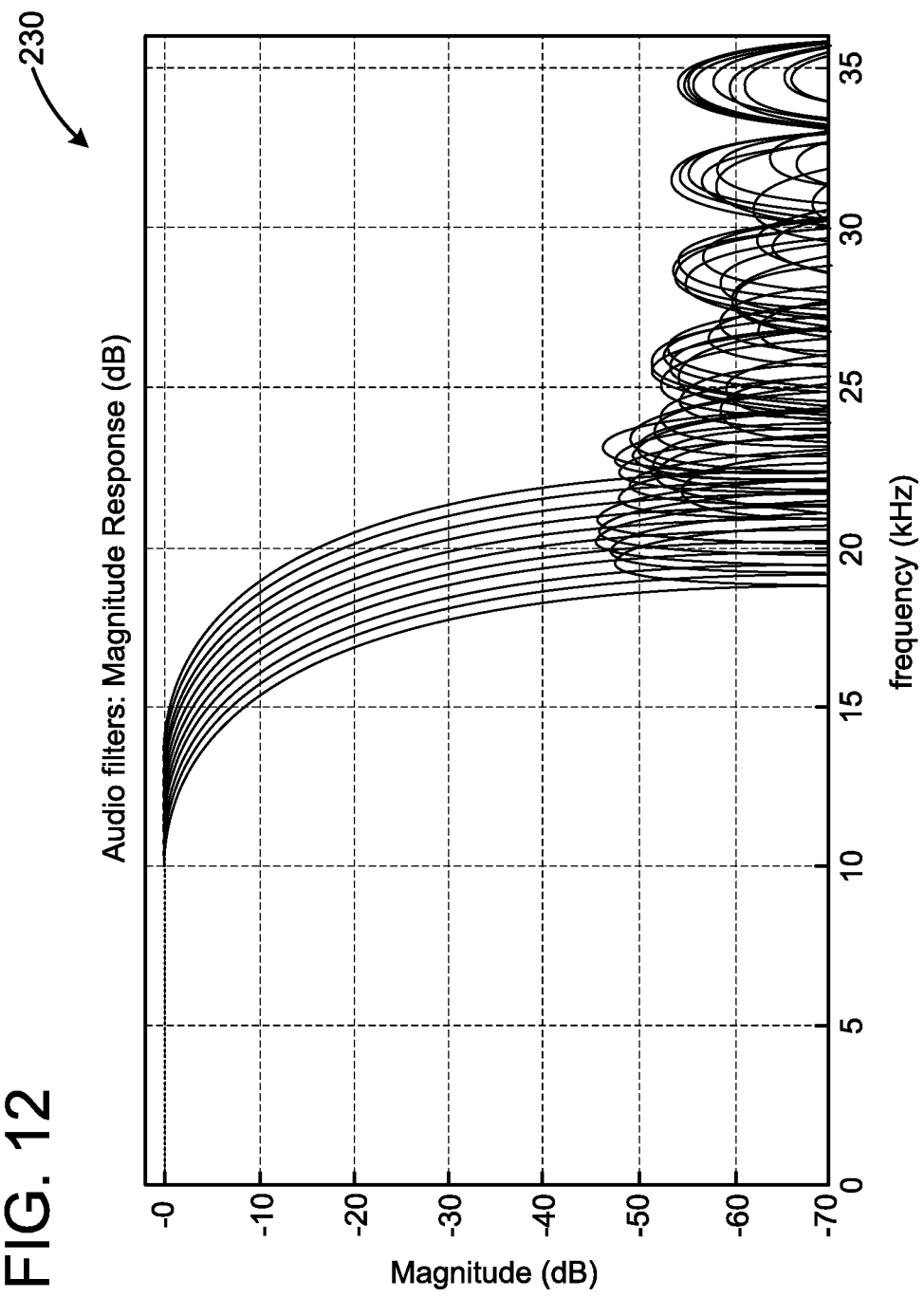
FIG. 12 is a schematic view showing FIR filter transfer curves for various $f_s$ compensation settings.

FIG. 12 is a graph 230 that shows the filter characteristics for various fs, corr values. In an equivalent way to the above mentioned examples, other sample-rate dependent settings or functions can be compensated for autonomously on-chip without any host-controller interaction. The above described techniques for the compensation of $f_s$ variations is not only limited to RF channel, i.e. tuning-dependent, $f_s$ variations. For example, an intentional shift of the VCO frequency can be used to avoid particular frequencies for coexistence reasons. This technique can either be used in a static or dynamic manner. It has to be noted that the method for implementing variable cut-off frequency FIR filters can not only be used for $f_s$ corrections, but anywhere else where the system requires a variable cut-off frequency FIR filter.

The underlying concepts and techniques of the present invention are not limited to a pure receiver functionality, but can easily be extended to transmitter and transceiver concepts. In the following example, one of the previously shown multi-standard multi-tuner receivers is extended with FM transmit functionality.

Figure 13:
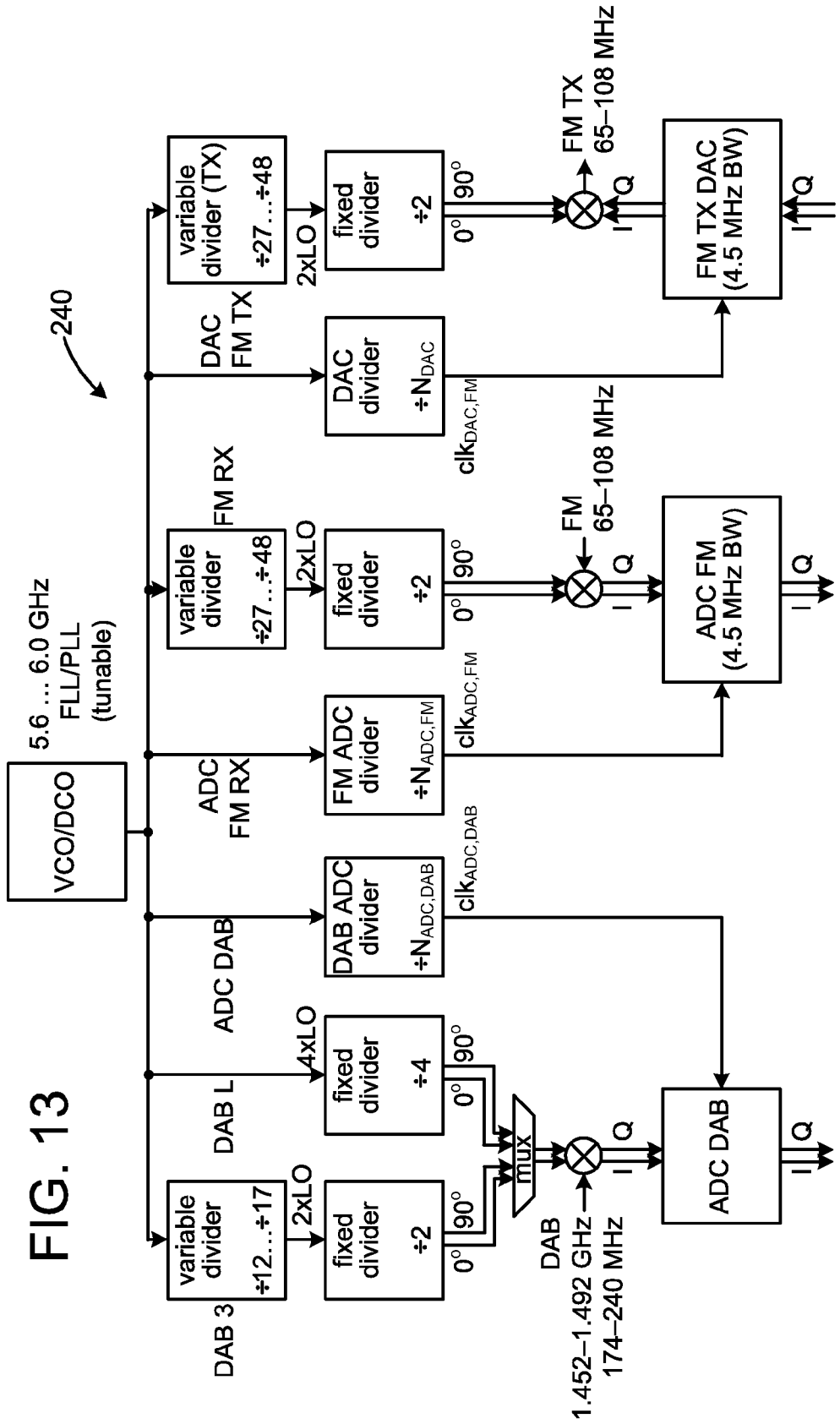
FIG. 13 is a schematic view of a combined FM/DAB receiver with FM transmitter functionality.

Consider the combined FM/DAB receiver shown in FIG. 10. By reversing the signal flow and exchanging the ADC functionality of the FM receiver section of FIG. 10 with a Digital To Analog Conversion circuitry (DAC), it is possible to obtain an up-conversion transmit (TX) concept 240 as depicted in FIG. 13. Given that the FM TX RF frequency range is the same as the FM RX RF frequency range, the bandwidth requirements for the FM TX DAC follow the same criteria as for the FM RX ADC. This holds also for the variable divider range. It should be noted that for the transmit section frequency offset corrections translate to frequency pre-compensations. It is not required to employ a traditional up-conversion TX concept, also direct digital modulation concepts could be used. In any case, the $f_s$ corrections explained earlier can be applied in a similar manner as for the RX path.

While the present invention has been described in accordance with preferred compositions and embodiments, it is to be understood that certain substitutions and alterations may be made thereto without departing from the spirit and scope of the following claims.

The invention claimed is:

1. A method of multi-tune implementation incorporation frequency offset correction, comprising:
providing a single fixed frequency oscillator electronically connected to a divider and providing an input channel in communication with the divider and an analog-to-digital converter, the input channel having a first bandwidth, the converter having a second bandwidth, the second bandwidth being broader than the first bandwidth, the single fixed frequency oscillator operating at a frequency higher than frequencies inside an entire reception band of the input channel,
the divider dividing the frequency of the single fixed frequency oscillator, wherein the divided frequency being used as input for producing sub-bands of frequencies that cover the entire reception band, operating at least two tuners concurrently based on the single fixed frequency oscillator, and
using a difference between a measured oscillator frequency of the single fixed frequency oscillator and a required frequency to determine a frequency offset value to correct the measured oscillator frequency at an intermediate frequency to baseband converter, in a feed-forward manner.

2. The method of claim 1 wherein the method further comprises the sub-bands cover an entire Frequency Modulation (FM) band ranging from 62 MHz to 111 MHz.

3. The method of claim 1 wherein the method further comprises generating over-lapping sub-bands of frequencies.

4. The method of claim 1 wherein the method further comprises connecting a plurality of Frequency Modulation (FM) receivers to the multi-tuners.

5. The method of claim 4 wherein the method further comprises connecting a global position system receiver to the multi-tuners.

6. The method of claim 4 wherein the method further comprises connecting a Digital Audio Broadcasting (DAB) receiver to the multi-tuner.

7. The method of claim 1 wherein the method further comprises generating any Frequency Modulation (FM) radio frequency from at least two sub-bands of frequencies.

8. The method of claim 1 wherein the method further comprises the single fixed frequency oscillator producing over-lapping sub-bands that cover the entire reception band.

9. The method of claim 7 wherein the method further comprises generating one frequency using different oscillator frequencies.

10. The method of claim 8 wherein the method further comprises the step of generating over-lapping sub-bands using different oscillator frequencies.

* * * * *